United States Patent
Johansson

(10) Patent No.: US 8,969,774 B2
(45) Date of Patent: Mar. 3, 2015

(54) CONVERSION CIRCUITRY FOR REDUCING PIXEL ARRAY READOUT TIME

(71) Applicant: OmniVision Technologies, Inc., Santa Clara, CA (US)

(72) Inventor: Robert Johansson, Oslo (NO)

(73) Assignee: OmniVision Technologies, Inc., Santa Clara, CA (US)

( * ) Notice: Subject to any disclaimer, the term of this patent is extended or adjusted under 35 U.S.C. 154(b) by 315 days.

(21) Appl. No.: 13/728,716

(22) Filed: Dec. 27, 2012

(65) Prior Publication Data

US 2014/0183333 A1 Jul. 3, 2014

(51) Int. Cl.
*H01L 27/00* (2006.01)
*H03M 1/12* (2006.01)
*H04N 5/378* (2011.01)
*H03M 1/46* (2006.01)

(52) U.S. Cl.
CPC .............. *H04N 5/378* (2013.01); *H03M 1/123* (2013.01); *H03M 1/466* (2013.01)
USPC ....................................... 250/208.1; 341/172

(58) Field of Classification Search
USPC ........................................ 250/208.1; 341/172
See application file for complete search history.

(56) References Cited

U.S. PATENT DOCUMENTS 8,754,800 B2 * 6/2014 Cowley et al. ............... 341/172

OTHER PUBLICATIONS

Min-Seok Shin et al.; "A 1.92-Megapixel CMOS Image Sensor With Column-Parallel Low-Power and Area-Efficient SA-ADCs," Electron Devices, IEEE Transactions on , vol. 59, No. 6, pp. 1693-1700, Jun. 2012 doi: 10.1109/TED.2012.2190936.

Matsuo, S. et al.; "A very low column FPN and row temporal noise 8.9 M-pixel, 60 fps CMOS image sensor with 14bit column parallel SA-ADC," 2008 Symposium on VLSI Circuits Digest of Technical Papers, 2008 IEEE; pp. 138-139.

* cited by examiner

*Primary Examiner* — Thanh Luu
(74) *Attorney, Agent, or Firm* — Blakely Sokoloff Taylor & Zafman LLP

(57) ABSTRACT

An image sensor includes a pixel array having pixels arranged in rows and columns, a first successive-approximation-register ("SAR") analog-to-digital-converter ("ADC"), a second SAR ADC, and first and second control circuitry. The first SAR ADC includes a first capacitor array ("FCA") that shares a first common terminal coupled to a first comparator and coupled to receive first analog pixel signals. The second SAR ADC includes a second capacitor array ("SCA") that shares a second common terminal selectably coupled to a second comparator and coupled to receive second analog pixel signals. The first and second control modules are coupled to selectably switch bottom plates of the FCA from a low reference voltage to the high reference voltage at a same time as selectably switching bottom plates of the SCA from a high reference voltage to the low reference voltage.

20 Claims, 4 Drawing Sheets

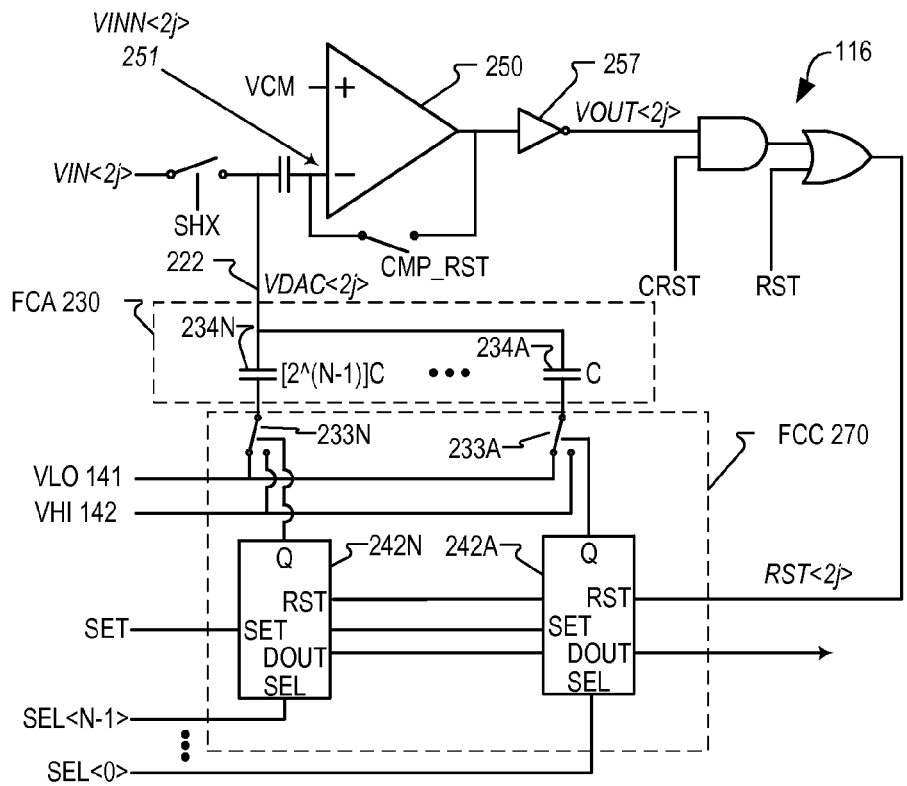
FIG. 2A (EVEN COLUMNS SAR-ADC)
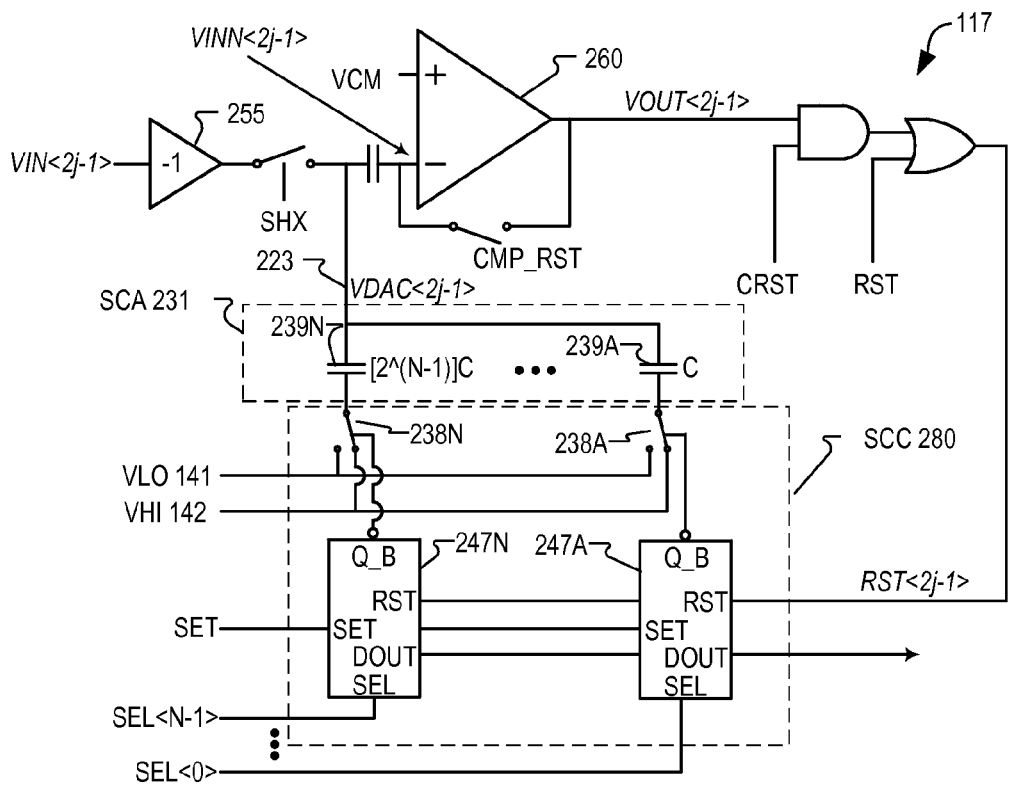
FIG. 2B (ODD COLUMNS SAR-ADC)

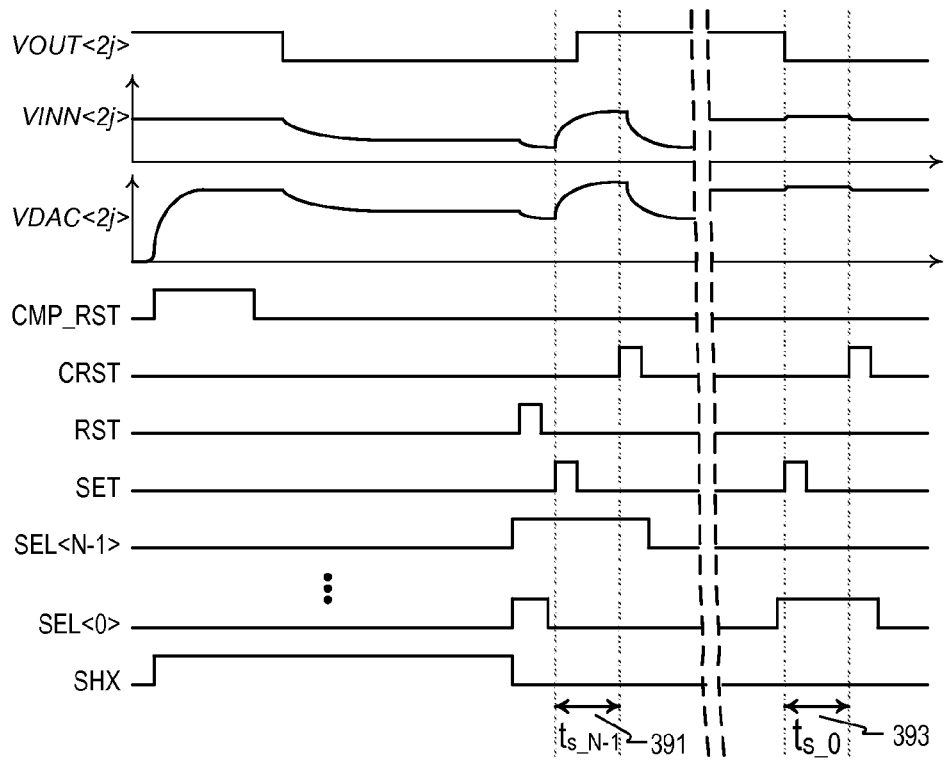
FIG. 3A (EVEN COLUMNS)
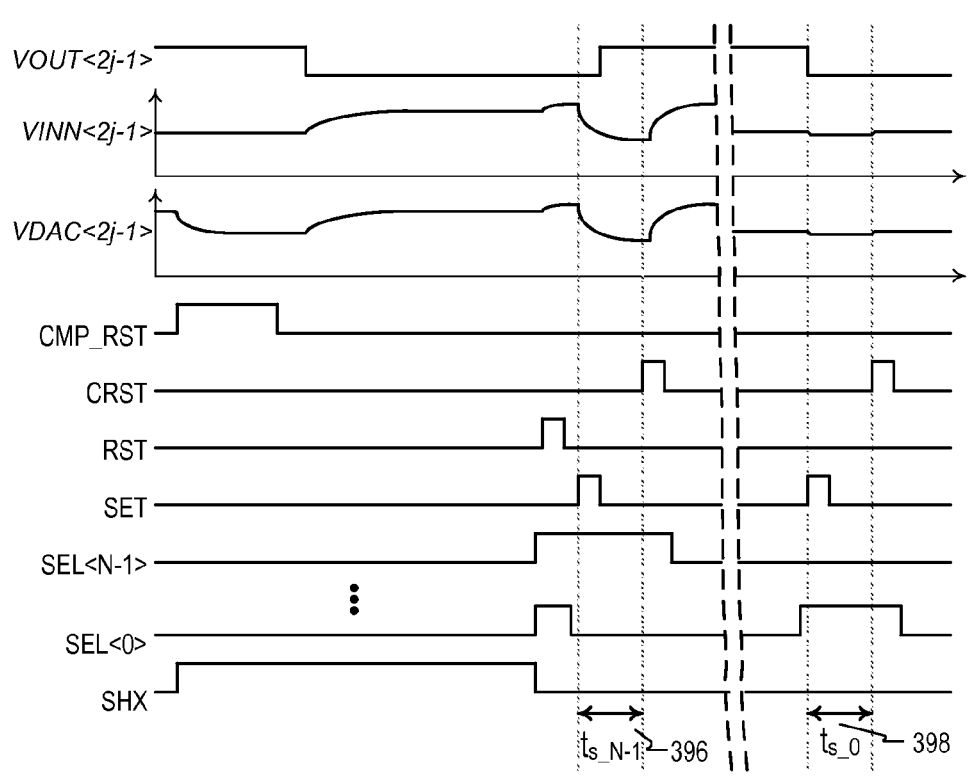
FIG. 3B (ODD COLUMNS)

CONVERSION CIRCUITRY FOR REDUCING PIXEL ARRAY READOUT TIME

TECHNICAL FIELD

This disclosure relates generally to optics, and in particular, but not exclusively, relates to image sensors.

BACKGROUND INFORMATION

Image sensors are used in a wide variety of application, for example, digital cameras, cellular phones, security cameras, as well as various other medical automobile, military, and other applications. As image sensors become ubiquitous in everyday life, the consumers and industry demand image sensors that are faster, smaller, and lower power. In some applications, image sensors must capture images in sequence, and preferably at a high frame-rate. However, conventional image sensors are limited by a variety of factors to produce high quality images at a high frame-rate.

One of the factors that limits the frame-rate of a given image sensor is the speed of conversion circuitry that converts analog pixel signals from a pixel array to digital image values. Within the conversion circuitry, some image sensors rely on Successive Approximation Register ("SAR") analog-to-digital converters ("ADC") to convert the analog pixel signals to the digital image values. Therefore, it would advantageous to increase the speed of the SAR ADCs within the conversion circuitry.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIGS. 2A and 2B illustrate example configurations of SAR ADCs disposed within conversion circuitry illustrated in FIG. 1, in accordance with an embodiment of the disclosure.

FIGS. 3A and 3B illustrate example timing sequences associated with the SAR ADCs of FIGS. 2A, and 2B, respectively, in accordance with an embodiment of the disclosure.

DETAILED DESCRIPTION

Embodiments of a system and method for reducing pixel array readout times are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
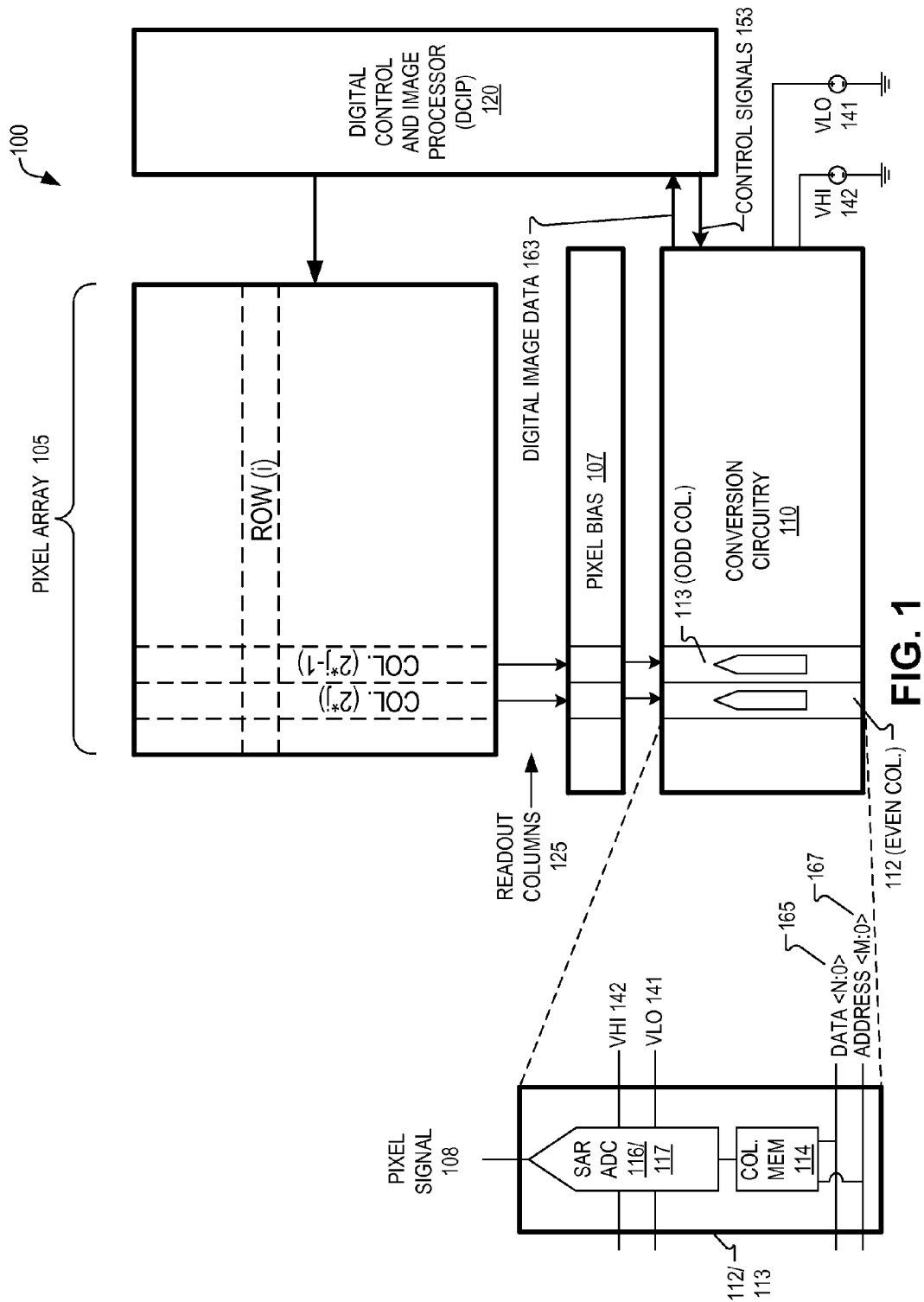
FIG. 1 illustrates a system diagram of an image sensor including example conversion circuitry for reading out a pixel array, in accordance with an embodiment of the disclosure.

FIG. 1 is a block diagram of an image sensor 100 that includes a pixel array 105 coupled to a digital control and image processor ("DCIP") 120. Pixel array 105 is coupled to pixel bias circuitry 107, which is coupled to conventional conversion circuitry 110. DCIP 120 is coupled to pixel array 105 to control operational characteristics of pixel array 105. For example, DCIP 120 may generate a shutter signal for controlling image acquisition. The shutter signal may be a global shutter signal or a rolling shutter signal.

Pixel array 105 includes a two-dimensional array of pixels arranged in rows and columns, as illustrated. During image acquisition, each of the pixels in pixel array 105 may generate image charge from photons striking a photosensitive element of the pixel. Each pixel in pixel array 105 may be a complementary metal oxide semiconductor (CMOS) pixel.

After each pixel has acquired its image charge, conversion circuitry 110 reads out and converts the analog pixel signals representing the generated image charge into digital image data 163. DCIP 120 is coupled to conversion circuitry 110 to receive digital image data 163 from conversion circuitry 110. Pixel bias circuitry 107 may be coupled between conversion circuitry 110 and pixel array 105 to bias the analog pixel signals before they are converted by conversion circuitry 110.

Conversion circuitry 110 may readout a row of image data at a time along readout column lines 125. In FIG. 1, conversion circuitry 110 includes conversion modules 111 and 112 for each column of pixel array 105 to convert the analog pixel signals generated in each of the columns. In the illustrated embodiment, even column conversion module 112 is configured to receive analog pixel signals generated by an even column (column 2j) of pixel array 105 and odd column conversion module 113 is configured to receive analog pixel signals generated by an odd column (column 2j−1) of pixel array 105.

The zoomed in view of the conversion module 112/113 (as notated by the dashed lines) shows that even column conversion module 112 includes SAR ADC 116 and odd column conversion module 113 includes SAR ADC 117. Each SAR ADC 116/117 is coupled to receive a low reference voltage 141 and a high reference voltage 142. Additionally, each conversion module 112/113 includes column memory circuitry 114 coupled to receive control signals 153 from DCIP 120. Example control signals may include address signals 167. Column memory circuitry 114 may also be coupled to output data signals 165 that include the digital image signals.

FIG. 2A illustrates an SAR ADC 116 that may be included in even column conversion module 112 of conversion circuitry 110. Top plates of each of the capacitors (234A through 234N) in FCA 230 are connected to common terminal 222 and common terminal 222 is coupled to an input of comparator 250. In the illustrated embodiment, common terminal 222 is selectably coupled to receive analog pixel signals generated in a first column (e.g. 2j) of pixel array 105. Bottom plates of FCA 230 are selectably coupled to switch from low reference voltage 141 to high reference voltage 142 to charge the capacitors of FCA 230 (e.g. MSB capacitor 234N) when a binary search sequence is initiated. In one embodiment, the bottom plates of FCA 230 are selectably coupled to switch from low reference voltage 141 to high reference voltage 142 by switches 233A through 233N, as illustrated. Switches 233A through 233N may be implemented using transistors.

FCA 230 includes N number of capacitors, where N is the number of bits of resolution of SAR ADC 116. The capacitor values within FCA 230 are configured for executing a binary search sequence. In FIG. 2A, the capacitors are binary weighted, meaning a least-significant-bit ("LSB") capacitor 234A has a value of C and each subsequent capacitor in FCA 230 has a value approximately twice as large as the previous capacitor, until the most significant bit ("MSB") capacitor 234N has a value of approximately $2^{\wedge}(N-1)*C$, where N is the number of bits of resolution in SAR ADC 116.

FIG. 3A illustrates a timing sequence associated with the SAR ADC 116 of FIG. 2A. To complete an analog to digital conversion, a binary search sequence is executed. To start, an input voltage (e.g. biased pixel signal 108) from a column is sampled onto common terminal 222 of FCA 230. After the input voltage has been sampled onto common terminal 222 of FCA 230, a charge proportional to the input voltage is stored on FCA 230. Then, switch 233N couples a bottom plate of MSB capacitor 234N from the low reference voltage 141 to the high reference voltage 142, which charges MSB capacitor 234N from low to high. Charging up MSB capacitor 234N represents ½ of high reference voltage 142. The voltage on comparator input 251 is then compared to the common voltage (e.g. ground) on the positive input of comparator 250 and comparator 250 outputs a digital bit that signifies if the input voltage was lower or higher than ½ of high reference voltage 142. If the input voltage was higher than ½ of high reference voltage 142, register 242A is set and switch 233 continues coupling the bottom plate of MSB capacitor 234N to high reference voltage 142. Otherwise, register 242N is not set and switch 233N couples the bottom plate of MSB capacitor 234N to low reference voltage 141. As is known in the art, the binary search sequence continues down through the capacitors in FCA 230 until a digital value for the input voltage is determined, by setting the registers 242A through 242N.

FIG. 2B illustrates an SAR ADC 117 that may be included in odd column conversion module 113 of conversion circuitry 110. Top plates of each of the capacitors (239A through 239N) in second capacitor array ("SCA") 231 are connected to common terminal 223 and common terminal 223 is coupled to an input of comparator 260. In the illustrated embodiment, common terminal 223 is selectably coupled to receive analog pixel signals generated in a second column (e.g. 2j−1) of pixel array 105. SCA 231 includes N number of capacitors, where N is the number of bits of resolution of SAR ADC 117, which is the same as the number of bits for SAR ADC 116. The capacitor values within SCA 231 are configured for executing a binary search sequence. In FIG. 2B, the capacitors are binary weighted.

Bottom plates of SCA 231 are coupled to switch from high reference voltage 142 to low reference voltage 141 to charge the capacitors of the SCA 231 (e.g. MSB capacitor 239N) when a binary search sequence is initiated. Therefore, it is noted that SAR ADC 116 and SAR ADC 117 charge their capacitors to opposite voltage references, which may have opposite polarities. SAR ADC 116 and SAR ADC 117 are also coupled to charge their capacitors at substantially a same time in response to control signals 153 from DCIP 120. First control circuitry 270 is coupled to selectably switch the bottom plates of the FCA 230 from the VLO 141 to VHI 142 in response to control signals (e.g. control signals 153) at substantially the same time as second control circuitry 280 selectably switches the bottom plates of SCA 231 from VHI 142 to VLO 141 in response to the control signals.

To correct for the fact that SCA 231 is being charged to an opposite reference as FCA 230, adjustments are made to SAR ADC 117 (as compared with SAR ADC 116) to still generate the proper digital voltage output. In the illustrated embodiment of FIG. 2B, inverter 255 is coupled to invert the analog pixel signal (VIN <2j−1>) generated by the second column in pixel array 105 and the inverter 257 that is coupled to the output of comparator 250 in SAR ADC 116 is removed. Additionally, the Q_B signal from registers 247A through 247N is inverted to properly control the switching of switches 238A through 238N, between VLO 141 and VHI 142. With these adjustments to SAR ADC 117, both SAR ADC 116 and SAR ADC 117 may generate the same expected digital values for a given analog pixel signal, in response to the same control signals. In other words, even with charging their capacitors to opposite voltage references, adjustments to the rest of the system (e.g. different control signals) may not be needed if SAR ADC 116 and SAR ADC 117 are configured as in FIGS. 2A and 2B. In one embodiment, inverter 255 is implemented as an inverting amplifier (with a gain of negative one).

Conventional image sensors are not configured to have conversion circuitry with SAR ADCs having capacitors that charge to opposite voltage references. In some conventional image sensors, all of the SAR ADCs in the conversion circuitry are all the same and the capacitors arrays charge to the same voltage reference. This can cause longer settling times for voltage reference because the capacitor arrays inside the SAR ADCs all tax the same voltage reference (at around the same time) by drawing charge from the voltage reference during the SAR ADC's binary search sequence.

In the illustrated embodiments of FIGS. 1-3, charging the capacitor arrays of SAR ADC 116 and SAR ADC 117 to opposite voltage references (at substantially the same time) during their respective binary search sequences may reduce the charging time of the capacitors by simply redistributing charge between FCA 230 and SCA 231 instead of redrawing all of the required charge for charging the capacitors from the voltage references (VLO 141 and VHI 142). Therefore, charge that was already stored within conversion circuitry 110 is used to quickly recharge the capacitors, rather than waiting for the voltage references to supply all of the required charge, as happens in conventional image sensors. By reducing the charge time of the capacitors, the settling time between comparisons in binary search sequences are reduced, which leads to faster analog-to-digital conversions, which makes higher frame-rates possible for the image sensor.

To illustrate, FIGS. 3A and 3B illustrate example binary search timing sequences associated with the SAR ADCs of FIGS. 2A, and 2B, respectively, in accordance with an embodiment of the disclosure. In FIG. 3A, settling times of SAR ADC 116 are illustrated. The settling times dominate the time it takes the voltage buffers (low voltage reference 141 and high voltage reference 142) to charge the capacitance (associate with a given bit) from reference 141 to reference 142. Specifically, time period 391 represents the time it takes to charge MSB capacitor 234N and settle the voltage references and time period 393 illustrates the time it takes to charge LSB capacitor 234A and settle the voltage references. In the case of MSB capacitor 234N, it has the largest value (and takes the longest time to charge) and is the first capacitor charged in a binary search sequence. Since MSB capacitor 234N is charged up for every binary search sequence, reducing its charge time would increase the speed of an SAR ADC. In turn, this would contribute to a higher frame rate capability in the image sensor.

FIGS. 3A and 3B show that SAR ADCs 116 and 117 can use the same control signals to produce digital values, even though FCA 230 and SCA 231 are charged to opposite references during their respective binary search sequences. FIG. 3A shows that at a start of a binary search sequence, VDAC<2j> responds to input voltage VIN<2j> being sampled onto common terminal 222. Signal SEL<N−1> selects MSB capacitor 234N and its bottom plate is switched from VLO 141 to VHI 142, as shown by the decreased voltage at node VDAC<2j> during time period 391. Similarly, at the end of the binary search sequence, signal SEL<0> selects LSB capacitor 234A and its bottom plate is switched from VLO 141 to VHI 142, as shown by the increased voltage at node VDAC<2j> during time period 393. The voltage change on VDAC<2j> is lower during time period 393 as compared to time period 391 because of the smaller capacitance value of LSB 234A as compared to MSB 234N. The un-illustrated timing sequences occurring between time period 391 and 393 will be understood by those skilled in the art.

FIG. 3B shows a second binary search sequence occurring in synchronization (at substantially the same time) with the binary search sequence shown in FIG. 3A. At the start of the second binary search sequence, VDAC<2j−1> responds to input voltage VIN<2j−1> being sampled onto common terminal 223. Signal SEL<N−1> selects MSB capacitor 239N and its bottom plate is switched from VHI 142 to VLO 141, as shown by the decreased voltage at node VDAC<2j−1> during time period 396. Similarly, at the end of the binary search sequence, signal SEL<0> selects LSB capacitor 239A and its bottom plate is switched from VHI 142 to VLO 141, as shown by the decreased voltage at node VDAC<2j−1> during time period 398. As stated above, charging the capacitor in FCA 230 and SCA 231 to different references at substantially a same time may speed up the settling times 391, 393, 396, and 398 (as compared with the prior art) by reducing the charging time of the capacitors. The reduced charging times of the capacitors may make faster frame-rates possible for pixel array 105.

Referring back to FIG. 1, conversion circuitry 110 may include a plurality of even column conversion modules 112 coupled to receive analog pixel signals generated by the even columns of pixel array 105 and conversion circuitry 110 may include a plurality of odd column conversion modules 113 coupled to receive analog pixel signals generated by the odd columns of pixel array 105. Pixel array 105 may include even and odd columns arranged in an every-other configuration, as shown. In other arrangements in the scope of this disclosure, SAR ADC 116 and SAR ADC 117 may not necessarily be paired strictly with even and odd columns of pixel array 105. In these other arrangements, it may be advantageous to have half the conversion circuitry include SAR ADC 116 and the other half include SAR ADC 117 so the capacitances being charged to opposite references is balanced, which may reduce settling times by reducing the charge required to be drawn from the voltage references.

In some embodiments, pixel array 105 may include pixels configured to receive different colors of light. In one embodiment, analog pixel signals generated by green pixels of the pixel array may be converted to digital signals by SAR ADCs configured as SAR ADC 116 is configured and analog pixel signals generated by red and blue pixels of the pixel array may be converted to digital signals by SAR ADCs configured as SAR ADC 117 is configured.

Figure 4:
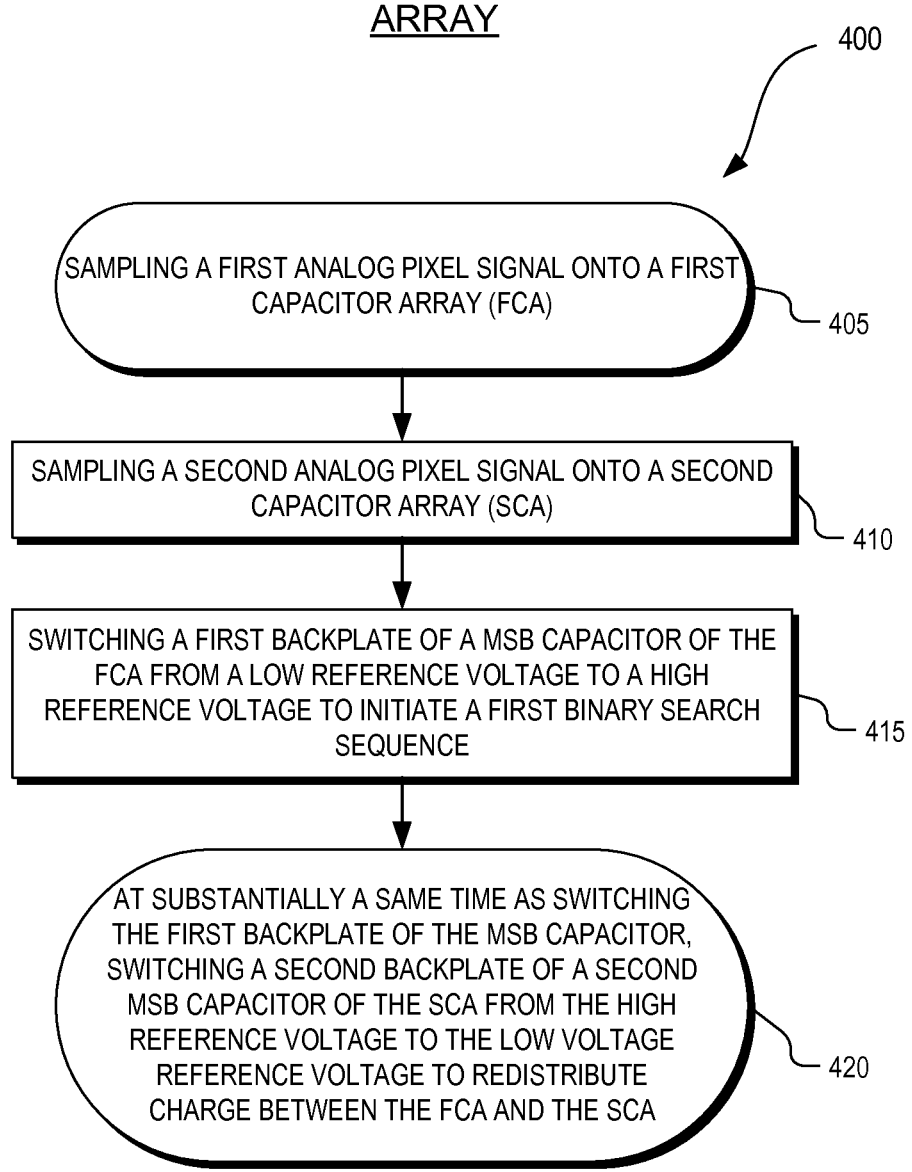
FIG. 4 shows a flow chart illustrating an example method of reading out a pixel array, in accordance with an embodiment of the disclosure.

FIG. 4 illustrates a flow chart 400 illustrating an example method of reading out a pixel array, in accordance with an embodiment of the disclosure. The order in which some or all of the process blocks appear in process 400 should not be deemed limiting. Rather, one of ordinary skill in the art having the benefit of the present disclosure will understand that some of the process blocks may be executed in a variety of orders not illustrated, or even in parallel.

In process block 405, a first analog pixel signal generated in a first column of a pixel array is sampled onto a common terminal (e.g. common terminal 222) of a first capacitor array ("FCA"). The first analog pixel signal may be generated in an even column of the pixel array and the capacitor array may be coupled to a first comparator. A second analog pixel signal generated in a second column of the pixel array is sampled onto a common terminal (e.g. common terminal 223) of a second capacitor array ("SCA") in process block 410. The second analog pixel signal may be generated in an odd column of the same pixel array and the capacitor array may be coupled to a second comparator different from the first comparator. The second analog pixel signal may be inverted before being sampling it onto the second capacitor array. The FCA and the SCA may include capacitors with binary-weighted values.

In process block 415, the bottom plate of a MSB capacitor (e.g. capacitor 234N) of the FCA is switched from a low reference voltage to a high reference voltage to initiate a binary search sequence for determining a digital value for the first analog pixel signal. In process block 420, the bottom plate of a MSB capacitor (e.g. capacitor 239N) of the SCA is switched from a high reference voltage to a low reference voltage to initiate a binary search sequence for determining a digital value for the second analog pixel signal. The bottom plates of the MSB capacitors are physically opposite the top plates of the MSB capacitors that are coupled to the respective common terminals. The bottom plates of the two MSB capacitors are switched at substantially a same time, which redistributes charge between the FCA and the SCA and reduces the amount of charge required to be drawn from the low and high reference voltages.

In one embodiment in process 400, the first comparator is reset before sampling the first analog signal onto the common terminal of the FCA and the second comparator is reset before sampling the second analog signal onto the second common terminal of the SCA. Pixels of the pixel array may be arranged in rows and columns and the columns of the pixel array may include even columns and odd columns interlaced in an every-other configuration. The first column of the pixel array may be even and the second column of the pixel array may be odd.

The first comparator and the FCA may be included in a first SAR ADC and the second comparator and the SCA may be included in a second SAR ADC. In one embodiment, either a first SAR ADC or a second SAR ADC is coupled to receive analog pixel signals generated by each column of the pixel array. The aggregate number of first and second SAR ADCs may be controlled synchronously so that the capacitors in the aggregate number of FCAs and SCAs are switched at substantially a same time, in order to properly redistribute the charge on the capacitors. The analog pixel signals generated by green pixels of the pixel array may be converted to digital signals by the first SAR ADCs and analog pixel signals generated by red and blue pixels of the pixel array may be converted to digital signals by the second SAR ADCs.

In discussing FIG. 2B above, modifications to SAR ADC 117 were described that would correct for charging SCA 231 to an opposite polarity as FCA 230. In one embodiment, to correct for the opposite polarity, inverter 255 in SAR ADC 117 may be eliminated and instead, the order in which pixel signals are sampled is reversed.

Typically, for a four transistor ("4T") pixel architecture, the sampling (which may be referred to as correlated double sampling "CDS") starts with the floating diffusion ("FD") and the photo diode ("PD") being reset. This depletes the PD of free charges so the reset operation does not store noise charges in the PD. Second, the pixel integrates image light. Third, the FD is reset and an FD reset value is read out. Fourth, charge is then transferred from the PD to the FD. Fifth, the FD value (which is representative of the light integrated by the pixel) is readout. In summary, the reset value is read out first and the signal value is read out second.

To reverse the order of sampling a pixel with a 4T architecture, the sampling sequence may start with resetting the FD and the PD. Second, the pixel integrates image light. Third, the FD is reset. Fourth, charge is transferred from the PD to the FD. Fifth, the signal value is read out. Sixth, the FD is reset and the reset value is read out.

Reversing the sequence of how pixels are read out effectively accomplishes the same result as inverting analog pixel signals. Therefore, SAR ADC 117 may be read out in a reverse sequence instead of including inverter 255.

Notably, reversing the sequence of reading out the pixels is not CDS, which may contribute to noisier readouts. However, CDS can be implemented while still supplying the signal value before the reset value to SAR ADC 117 by storing the reset value in a storage element (e.g. a sample and hold circuit).

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible non-transitory machine-readable storage medium includes any mechanism that provides (i.e., stores) information in a form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An image sensor comprising:
a pixel array having pixels arranged in rows and columns;
a first successive-approximation-register ("SAR") analog-to-digital-converter ("ADC") coupled to convert a first analog pixel signal to first digital data, the first SAR ADC including a first capacitor array ("FCA") with binary-weighted values, wherein top plates of the FCA share a first common terminal coupled to a first comparator input and bottom plates of the FCA are coupled to switch from a low reference voltage to a high reference voltage, and wherein the first common terminal is selectably coupled to receive the first analog pixel signal generated by a first column of the pixel array;
a second SAR ADC coupled to convert a second analog pixel signal to second digital data, the second SAR ADC including a second capacitor array ("SCA") with binary-weighted values, wherein top plates of the SCA share a second common terminal coupled to a second comparator input and bottom plates of the SCA are coupled to switch from the high reference voltage to the low reference voltage, and wherein the second common terminal is selectably coupled to an inverter output of an inverter that inverts the second analog pixel signal generated by a second column of the pixel array; and
first control circuitry of the first SAR ADC coupled to selectably switch the bottom plates of the FCA from the low reference voltage to the high reference voltage in response to control signals at substantially a same time as second control circuitry of the second SAR ADC selectably switches the bottom plates of the SCA from the high reference voltage to the low reference voltage in response to the control signals.

2. The image sensor of claim 1, wherein the first SAR ADC is one of a plurality of first SAR ADCs and the second SAR ADC is one of a plurality of second SAR ADCs, and wherein a given SAR ADC in the plurality of first SAR ADCs is coupled to receive odd column pixel signals generated by odd columns of the pixel array and a given SAR ADC in the plurality of second SAR ADCs is coupled to receive even column pixel signals generate by even columns of the pixel array, the columns of the pixel array including the even columns and the odd columns interlaced in an every-other configuration, the first column being one of the even columns and the second column being one of the odd columns.

3. The image sensor of claim 2, wherein green pixels of the pixel array are disposed in the odd columns and red and blue pixels of the pixel array are disposed in the even columns.

4. The image sensor of claim 1, wherein the FCA includes a most-significant-bit ("MSB") capacitor and the SCA includes another MSB capacitor, the first control circuitry coupled to sequentially switch the bottom plates of the FCA, starting with the MSB capacitor, from the low reference voltage to the high reference voltage in a first binary search sequence, and wherein the second control circuitry is coupled to sequentially switch the bottom plates of the SCA, starting with the another MSB capacitor, from the high reference voltage to the low reference voltage in a second binary search sequence.

5. The image sensor of claim 1, wherein the first SAR ADC and the second SAR ADC both have N number of bits of resolution and the FCA includes at least N capacitors and the SCA includes at least N capacitors.

6. The image sensor of claim 5, wherein a first most-significant-bit ("MSB") capacitor in the FCA has a first value of approximately two to the power of $(N-1)*C1$, where C1 is a first capacitance value of a first least-significant-bit ("LSB") capacitor in the FCA, and wherein a second MSB capacitor in the SCA has a second value of approximately two to the power of $(N-1)*C2$, where C2 is a second capacitance value of a second LSB capacitor in the SCA.

7. The image sensor of claim 1, wherein the first control circuitry includes first registers coupled to selectably switch first switches coupled to individually switch the bottom plates of the FCA from the low reference voltage to the high reference voltage in response to the control signals, and where the second control circuitry includes second registers coupled to selectably switch second switches coupled to individually switch the bottom plates of the SCA from the high reference voltage to the low reference voltage in response the control signals.

8. A method of reading out a pixel array, the method comprising:
sampling a first analog pixel signal onto a first common terminal of a first capacitor array ("FCA") that is coupled to a first comparator, wherein the first analog pixel signal is generated by a first column of the pixel array;
sampling a second analog pixel signal onto a second common terminal of a second capacitor array ("SCA") that is coupled to a second comparator, wherein the second analog pixel signal is generated by a second column of the pixel;
switching a first bottom plate of a most-significant-bit ("MSB") capacitor of the FCA from a low reference voltage to a high reference voltage to initiate a first binary search sequence for determining a first digital value for the first analog pixel signal; and
switching a second bottom plate of a second MSB capacitor of the SCA from the high reference voltage to the low reference voltage to initiate a second binary search sequence to determine a second digital value for the second analog pixel signal, wherein the first bottom plate and the second bottom plate are opposite the first and second common terminals, respectively, and wherein the first bottom plate is switched from the low reference voltage to the high reference at substantially a same time as the second bottom plate is switched from the high reference voltage to the low reference voltage to redistribute charge between the FCA and the SCA to reduce an amount of additional charge drawn from the low and high voltage references.

9. The method of claim 8 further comprising inverting the second analog pixel signal before sampling the second analog pixel signal onto the second common terminal.

10. The method of claim 8 further comprising:
resetting the first comparator before sampling the first analog signal onto the first common terminal of the FCA; and
resetting the second comparator before sampling the second analog pixel signal onto the second common terminal of the SCA.

11. The method of claim 8, wherein the pixel array is arranged in rows and columns and the columns of the pixel array include even columns and odd columns interlaced in an every-other configuration, the first column being an even column and the second column being an odd column.

12. The image sensor of claim 11, wherein green pixels of the pixel array are disposed in the odd columns and red and blue pixels of the pixel array are disposed in the even columns.

13. The image sensor of claim 8, wherein green pixel signals from green pixels of the pixel array are sampled onto the FCA but not sampled onto the SCA.

14. The image sensor of claim 8, wherein the FCA and the SCA include capacitors with binary-weighted values.

15. A non-transitory machine-accessible storage medium that provides instructions that, when executed by a machine, will cause the machine to perform operations comprising:
sampling a first analog pixel signal onto a first common terminal of a first capacitor array ("FCA") that is coupled to a first comparator, wherein the first analog pixel signal is generated by a first column of the pixel array;
sampling a second analog pixel signal onto a second common terminal of a second capacitor array ("SCA") that is coupled to a second comparator, wherein the second analog pixel signal is generated by a second column of the pixel;
switching a first bottom plate of a most-significant-bit ("MSB") capacitor of the FCA from a low reference voltage to a high reference voltage to initiate a first binary search sequence for determining a first digital value for the first analog pixel signal; and
switching a second bottom plate of a second MSB capacitor of the SCA from the high reference voltage to the low reference voltage to initiate a second binary search sequence to determine a second digital value for the second analog pixel signal, wherein the first bottom plate and the second bottom plate are opposite the first and second common terminals, respectively, and wherein the first bottom plate is switched from the low reference voltage to the high reference at substantially a same time as the second bottom plate is switched from the high reference voltage to the low reference voltage to redistribute charge between the FCA and the SCA to reduce an amount of additional charge drawn from the low and high voltage references.

16. The non-transitory machine-accessible storage medium of claim 15, further providing instructions that, when executed by the machine, will cause the machine to perform further operations, comprising:
inverting the second analog pixel signal before sampling the second analog pixel signal onto the second common terminal.

17. The non-transitory machine-accessible storage medium of claim 15, further providing instructions that, when executed by the machine, will cause the machine to perform further operations, comprising:
resetting the first comparator before sampling the first analog signal onto the first common terminal of the FCA; and
resetting the second comparator before sampling the second analog pixel signal onto the second common terminal of the SCA.

18. The non-transitory machine-accessible storage medium of claim 15, wherein the pixel array is arranged in rows and columns and the columns of the pixel array include even columns and odd columns interlaced in an every-other configuration, the first column being an even column and the second column being an odd column.

19. The non-transitory machine-accessible storage medium of claim 18, wherein green pixels of the pixel array are disposed in the odd columns and red and blue pixels of the pixel array are disposed in the even columns.

20. The non-transitory machine-accessible storage medium of claim 15, wherein the FCA and the SCA include capacitors with binary-weighted values.

* * * * *